United States Patent
Maeda

(10) Patent No.: US 7,791,510 B2
(45) Date of Patent: Sep. 7, 2010

(54) ENCODING METHOD AND APPARATUS, AND PROGRAM

(75) Inventor: Yuuji Maeda, Tokyo (JP)

(73) Assignee: Sony Corporation, Tokyo (JP)

( * ) Notice: Subject to any disclaimer, the term of this patent is extended or adjusted under 35 U.S.C. 154(b) by 21 days.

(21) Appl. No.: 12/257,371

(22) Filed: Oct. 23, 2008

(65) Prior Publication Data
US 2009/0109070 A1 Apr. 30, 2009

(30) Foreign Application Priority Data
Oct. 25, 2007 (JP) ............................ P2007-277930

(51) Int. Cl.
*H03M 7/40* (2006.01)
(52) U.S. Cl. ............................ 341/67; 341/50; 341/51; 341/76; 382/244
(58) Field of Classification Search .................. 341/67, 341/76, 50, 51; 382/244, 162; 704/219
See application file for complete search history.

(56) References Cited

U.S. PATENT DOCUMENTS

| | | | | |
|---|---|---|---|---|
| 6,028,541 | A * | 2/2000 | Levine | 341/76 |
| 6,289,306 | B1 * | 9/2001 | Van Der Vleuten et al. | 704/219 |
| 7,171,053 | B2 * | 1/2007 | Van der Vleuten | 382/244 |
| 2005/0002563 | A1 * | 1/2005 | Hoshuyama | 382/162 |

FOREIGN PATENT DOCUMENTS

| | | |
|---|---|---|
| EP | 1 653 628 A1 | 5/2006 |
| JP | 2006-140772 | 6/2006 |
| WO | WO 02/071622 A2 | 9/2002 |

OTHER PUBLICATIONS

European Search Report dated Jun. 30, 2009.
Leon Bottou et al., "The Z-Coder Adaptive Binary Coder," Data Compression Conference, 1998, XP-002530096, pp. 13-22 (Mar. 30, 1998).
Marcelo J. Weinberger et al., The LOCO-I Lossless Image Compression Algorithm: Principles and Standardization into JPEG-LS, IEEE Transactions on Image Processing, vol. 9, No. 8, pp. 1309-1324, Aug. 2000.

* cited by examiner

*Primary Examiner*—Jean B Jeanglaude
(74) *Attorney, Agent, or Firm*—Finnegan, Henderson, Farabow, Garrett & Dunner, L.L.P.

(57) ABSTRACT

An encoding method for dividing a bit string of an input signal at a position of x bits from a least significant bit into a high-order bit string and a low-order bit string, performing variable-length-encoding of the high-order bit string, and performing fixed-length-encoding of the low-order bit string includes deriving a reference integer I close to $2^x$ (x=m/2, m is an integer of 0 or more); obtaining a quotient and a remainder that are determined by performing a dividing operation on numerical values represented respectively by the bit strings by using the reference integer I; and performing variable-length-encoding of each of quotients of two consecutive bit strings, combining remainders corresponding to the quotients and performing fixed-length-encoding of the result, and generating a codeword.

24 Claims, 6 Drawing Sheets

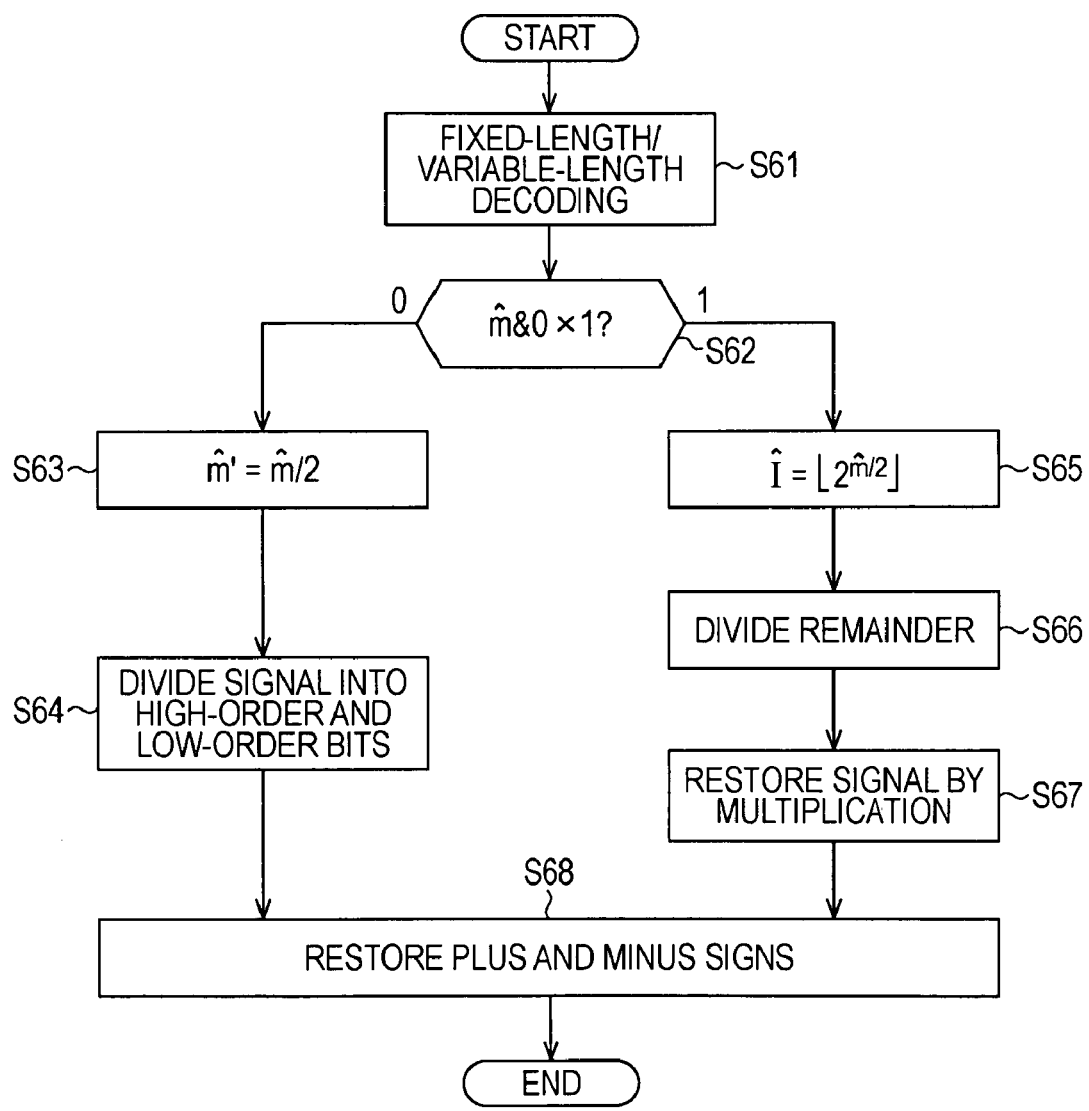

ENCODING METHOD AND APPARATUS, AND PROGRAM

CROSS REFERENCES TO RELATED APPLICATIONS

The present invention contains subject matter related to Japanese Patent Application JP 2007-277930 filed in the Japanese Patent Office on Oct. 25, 2007, the entire contents of which are incorporated herein by reference.

BACKGROUND OF THE INVENTION

1. Field of the Invention

The present invention relates to entropy encoding that is widely used in lossless encoding of audio, images, and the like and also relates to an encoding method and apparatus for realizing high encoding efficiency and to a program therefor.

2. Description of the Related Art

Entropy encoding that is widely used in lossless encoding of audio, images, and the like, in particular, Golomb-Rice encoding, is a high-speed and simple technique in that it can be executed using only easy computations, such as shift computation and bit mask computations. This method is designed in such a manner that signals are individually divided at a certain bit position, the high-order bits are variable-length-encoded, and the low-order bits are fixed-length-encoded. For variable-length encoding, a method is often used in which a numerical value represented by the high-order bits is proportional to an encoded word length (see, for example, Japanese Unexamined Patent Application Publication No. 2006-140772).

SUMMARY OF THE INVENTION

In Golomb-Rice encoding described above, in general, a bit position at which division is performed is determined on the basis of an average amplitude of a signal, and is fitted to the distribution of the signal. However, since the bit position is at an integer numerical value, a number of excessive bits are allocated to the high-order bits or the low-order bits with respect to the actual distribution, with the result that there is a risk that the encoding efficiency is decreased.

It is desirable to provide an encoding method and apparatus capable of improving encoding efficiency, and a program therefor.

According to an embodiment of the present invention, there is provided an encoding method for dividing a bit string of an input signal at a position of x bits from a least significant bit into a high-order bit string and a low-order bit string, performing variable-length-encoding of the high-order bit string, and performing fixed-length-encoding of the low-order bit string, the encoding method including the steps of: deriving a reference integer I close to $2^x$ ($x=m/2$, m is an integer of 0 or more); obtaining a quotient and a remainder that are determined by performing a dividing operation on numerical values represented respectively by the bit strings by using the reference integer I; and performing variable-length-encoding of each of quotients of two consecutive bit strings, combining remainders corresponding to the quotients and performing fixed-length-encoding of the result, and generating a codeword.

According to another embodiment of the present invention, there is provided an encoding method for dividing a bit string of an input signal at a position of x bits from a least significant bit into a high-order bit string and a low-order bit string, performing variable-length-encoding of the high-order bit string, and performing fixed-length-encoding of the low-order bit string, the encoding method including the steps of: deriving a reference integer I close to $2^x$ ($x=m/n$, m is an integer of 0 or more, n is an integer of 3 or more); obtaining a quotient and a remainder that are determined by performing a dividing operation on numerical values represented respectively by the bit strings by using the reference integer I; and performing variable-length-encoding of each of quotients of n consecutive bit strings, combining remainders corresponding to the quotients and performing fixed-length-encoding of the result, and generating a codeword.

According to another embodiment of the present invention, there is provided an encoding apparatus for dividing a bit string of an input signal at a position of x bits from a least significant bit into a high-order bit string and a low-order bit string, performing variable-length-encoding of the high-order bit string, and performing fixed-length-encoding of the low-order bit string, the encoding apparatus including: deriving means for deriving a reference integer I close to $2^x$ ($x=m/2$, m is an integer of 0 or more); obtaining means for obtaining a quotient and a remainder that are determined by performing a dividing operation on numerical values represented by the bit strings by using the reference integer I; and encoding means for performing variable-length-encoding of each of quotients of two consecutive bit strings, combining remainders corresponding to the quotients and performing fixed-length-encoding of the result, and generating a codeword.

According to another embodiment of the present invention, there is provided an encoding apparatus for dividing a bit string of an input signal at a position of x bits from a least significant bit into a high-order bit string and a low-order bit string, performing variable-length-encoding of the high-order bit string, and performing fixed-length-encoding of the low-order bit string, the encoding apparatus including: deriving means for deriving a reference integer I close to $2^x$ ($x=m/n$, m is an integer of 0 or more, n is an integer of 3 or more); obtaining means for obtaining a quotient and a remainder that are determined by dividing numerical values represented by the bit strings by using the reference integer I; and encoding means for performing variable-length-encoding of each of quotients of n consecutive bit strings, combining remainders corresponding to the quotients and performing fixed-length-encoding of the result, and generating a codeword.

According to another embodiment of the present invention, there is provided a program for causing a computer to perform processing for dividing a bit string of an input signal at a position of x bits from a least significant bit into a high-order bit string and a low-order bit string, performing variable-length-encoding of the high-order bit string, and performing fixed-length-encoding of the low-order bit string, the processing including the steps of: deriving a reference integer I close to $2^x$ ($x=m/2$, m is an integer of 0 or more); obtaining a quotient and a remainder that are determined by dividing numerical values represented by the bit strings by using the reference integer I; and performing variable-length-encoding of each of quotients of two consecutive bit strings, combining remainders corresponding to the quotients and performing fixed-length-encoding of the result, and generating a codeword.

According to another embodiment of the present invention, there is provided a program for causing a computer to perform processing for dividing a bit string of an input signal at a position of x bits from a least significant bit into a high-order bit string and a low-order bit string, performing variable-length-encoding of the high-order bit string, and performing fixed-length-encoding of the low-order bit string, the processing including the steps of: deriving a reference integer I close to $2^x$ (x=m/n, m is an integer of 0 or more, n is an integer of 3 or more); obtaining a quotient and a remainder that are determined by performing a dividing operation on numerical values represented respectively by the bit strings by using the reference integer I; and performing variable-length-encoding of each of quotients of n consecutive bit strings, combining remainders corresponding to the quotients and performing fixed-length-encoding of the result, and generating a codeword.

According to another embodiment of the present invention, there is provided a decoding method for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding method including the steps of: decoding, from the codeword, a quotient obtained by performing a dividing operation on each of numerical values represented respectively by two consecutive bit strings by using a reference integer I, and a combined remainder in which remainders corresponding to the quotients are combined; deriving the reference integer I on the basis of the number of bits x (x=m/2, m is an integer of 0 or more); dividing the combined remainder into two remainders on the basis of the reference integer I; and generating a bit string by multiplying the quotient by the reference integer I and by adding, to the result, a remainder corresponding to the quotient.

According to another embodiment of the present invention, there is provided a decoding method for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding method including the steps of: decoding, from the codeword, a quotient obtained by performing a dividing operation on each of numerical values represented respectively by n (n is an integer of 3 or more) consecutive bit strings by using a reference integer I, and a combined remainder in which remainders corresponding to the quotients are combined; deriving the reference integer I on the basis of the number of bits x (x=m/n, m is a natural number); dividing the combined remainder into n remainders on the basis of the reference integer I; and generating a bit string by multiplying the quotient by the reference integer I and by adding, to the result, a remainder corresponding to the quotient.

According to another embodiment of the present invention, there is provided a decoding apparatus for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding apparatus including: decoding means for decoding, from the codeword, a quotient obtained by performing a dividing operation on each of numerical values represented respectively by two consecutive bit strings by using a reference integer I, and a combined remainder in which remainders corresponding to the quotients are combined; deriving means for deriving the reference integer I on the basis of the number of bits x (x=m/2, m is an integer of 0 or more); remainder dividing means for dividing the combined remainder into two remainders on the basis of the reference integer I; and generation means for generating a bit string by multiplying the quotient by the reference integer I and by adding, to the result, a remainder corresponding to the quotient.

According to another embodiment of the present invention, there is provided a decoding apparatus for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding apparatus including: decoding means for decoding, from the codeword, a quotient obtained by performing a dividing operation on each of numerical values represented respectively by n (n is an integer of 3 or more) consecutive bit strings by using a reference integer I, and a combined remainder in which remainders corresponding to the quotients are combined; deriving means for deriving the reference integer I on the basis of the number of bits x (x=m/n, m is an integer of 0 or more); remainder dividing means for dividing the combined remainder into n remainders on the basis of the reference integer I; and generation means for generating a bit string by multiplying the quotient by the reference integer I and by adding, to the result, a remainder corresponding to the quotient.

According to another embodiment of the present invention, there is provided a program for causing a computer to perform processing for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the processing including the steps of: decoding, from the codeword, a quotient obtained by performing a dividing operation on each of numerical values represented respectively by two consecutive bit strings by using a reference integer I, and a combined remainder in which remainders corresponding to the quotients are combined; deriving the reference integer I on the basis of the number of bits x (x=m/2, m is an integer of 0 or more); dividing the combined remainder into two remainders on the basis of the reference integer I; and generating a bit string by multiplying the quotient by the reference integer I and by adding, to the result, a remainder corresponding to the quotient.

According to another embodiment of the present invention, there is provided a program for causing a computer to perform processing for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the processing including the steps of: decoding, from the codeword, a quotient obtained by performing a dividing operation on each of numerical values represented respectively by n (n is an integer of 3 or more) consecutive bit strings by using a reference integer I, and a combined remainder in which remainders corresponding to the quotients are combined; deriving the reference integer I on the basis of the number of bits x (x=m/n, m is an integer of 0 or more); dividing the combined remainder into n remainders on the basis of the reference integer I; and generating a bit string by multiplying the quotient by the reference integer I and by adding, to the result, a remainder corresponding to the quotient.

According to the embodiments of the present invention, by virtually setting a bit position x from the least significant bit of a bit string to be m/n so that the bit string is subdivided, it is possible to allocate an appropriate number of bits to the high-order bits or the low-order bits with respect to the distribution of a signal, making it possible to improve encoding efficiency.

BRIEF DESCRIPTION OF THE DRAWINGS

FIG. 6 is a flowchart showing processing of the entropy decoder.

DESCRIPTION OF THE PREFERRED EMBODIMENTS

Specific embodiments of the present invention will be described in detail below with reference to the drawings. The present invention is intended to be mainly used in a case where digital signals of audio, images, and the like are subjected to lossless encoding. By virtually setting a bit position x from the least significant bit to be m/n (m is an integer of 0 or more, n is an integer of 2 or more) so as to be subdivided, an appropriate number of bits are allocated to the high-order bits or the low-order bits with respect to the distribution of a signal. Here, first, a description will be given of encoding and decoding of an audio signal in the case of n=2. Next, a description will be given of a case in which n is an integer of 3 or more.

Encoding Process

Figure 1:
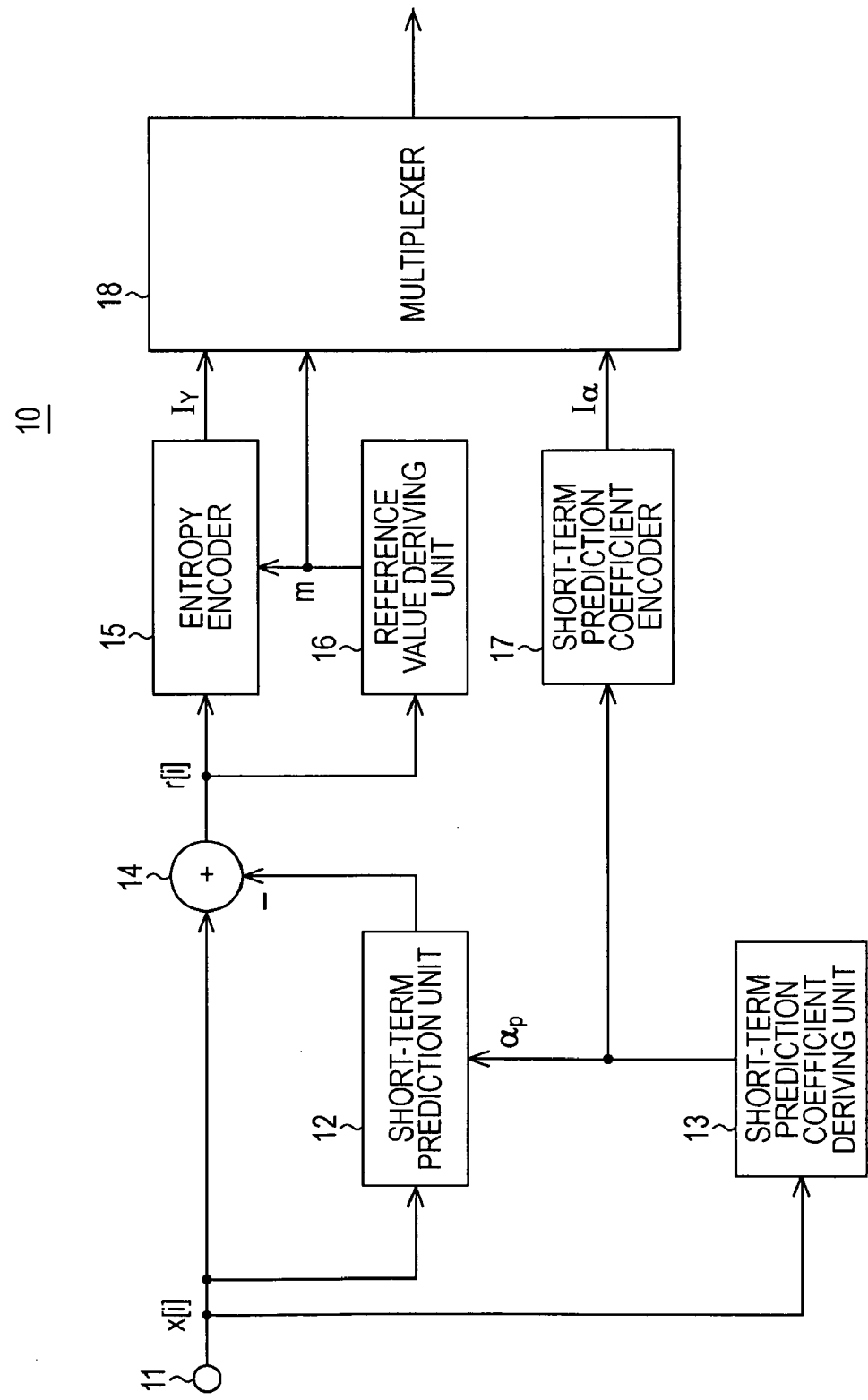
FIG. 1 is a block diagram showing the configuration of an encoder.

FIG. 1 is a block diagram showing the configuration of an encoder 10. The encoder 10 includes an input terminal 11 to which an audio signal x[i] is input, a short-term prediction unit 12 for predicting a current signal from a proximity sample on the basis of a short-term prediction coefficient $\alpha_p$, a short-term prediction coefficient deriving unit 13 for deriving the short-term prediction coefficient $\alpha_p$, an adder 14 for computing a predicted residual signal r[i] on the basis of the audio signal x[i] from the input terminal 11 and an output signal from the short-term prediction unit 12, an entropy encoder 15 for converting the predicted residual signal r[i] into a codeword $I_Y$ on the basis of the bit position m/2, a reference value deriving unit 16 for deriving a bit position m/2 from the least significant bit at which the predicted residual signal r[i] is to be encoded, a short-term prediction coefficient encoder 17 for converting the short-term prediction coefficient $\alpha_p$ into a codeword $I_\alpha$, and a multiplexer 18 for multiplexing the codeword $I_Y$, the reference bit position m, and the codeword $I_\alpha$.

An audio signal, which is divided at intervals of a predetermined frame length N, is input to the input terminal 11. In general, the audio signal is a signal in which the correlation between proximity samples is high. As a result of a short-term prediction process being performed by the short-term prediction unit 12 that removes this correlation and the adder 14, a predicted residual signal r[i] is obtained.

$$r[i] = x[i] - \sum_{p=1}^{P} \alpha_p x[i-p] \quad (i = 0 \ldots N-1) \qquad (1)$$

Here, x[i] indicates the audio signal, r[i] indicates the predicted residual signal, $\alpha_p$ indicates the short-term prediction coefficient, and P indicates the order of the short-term prediction coefficient.

The short-term prediction coefficient $\alpha_p$ is determined in such a manner that the short time correlation of the audio signal is removed in the short-term prediction coefficient deriving unit 13. For the calculation, a Levinson-Durbin algorithm is used. The short-term prediction coefficient $\alpha_p$ is converted into a codeword $I_\alpha$ by the short-term prediction coefficient encoder 17 and is sent to the multiplexer 18.

The reference value deriving unit 16 computes a bit position m/2 of the predicted residual signal r[i] from the least significant bit serving as a reference for encoding. For this calculation, for example, expression (2) can be used.

$$\frac{\sum_{i=0}^{N-1} |r[i]|}{N} \leq \lfloor 2^{m/2} \rfloor \qquad (2)$$

In expression (2), the left side indicates the average amplitude of the predicted residual signal r[i]. The reference value deriving unit 16 determines a minimum integer m that satisfies this inequality and sends it to the entropy encoder 15. Furthermore, the bit position m/2 is sent to the multiplexer 18. For deriving m, another method may be used.

The entropy encoder 15 converts the predicted residual signal r[i] into a codeword $I_Y$ on the basis of the bit position m/2, as will be described later. The codeword $I_Y$ is transferred to the multiplexer 18.

The multiplexer 18 performs multiplexing of codewords and outputs multiplexed data.

Figure 2:
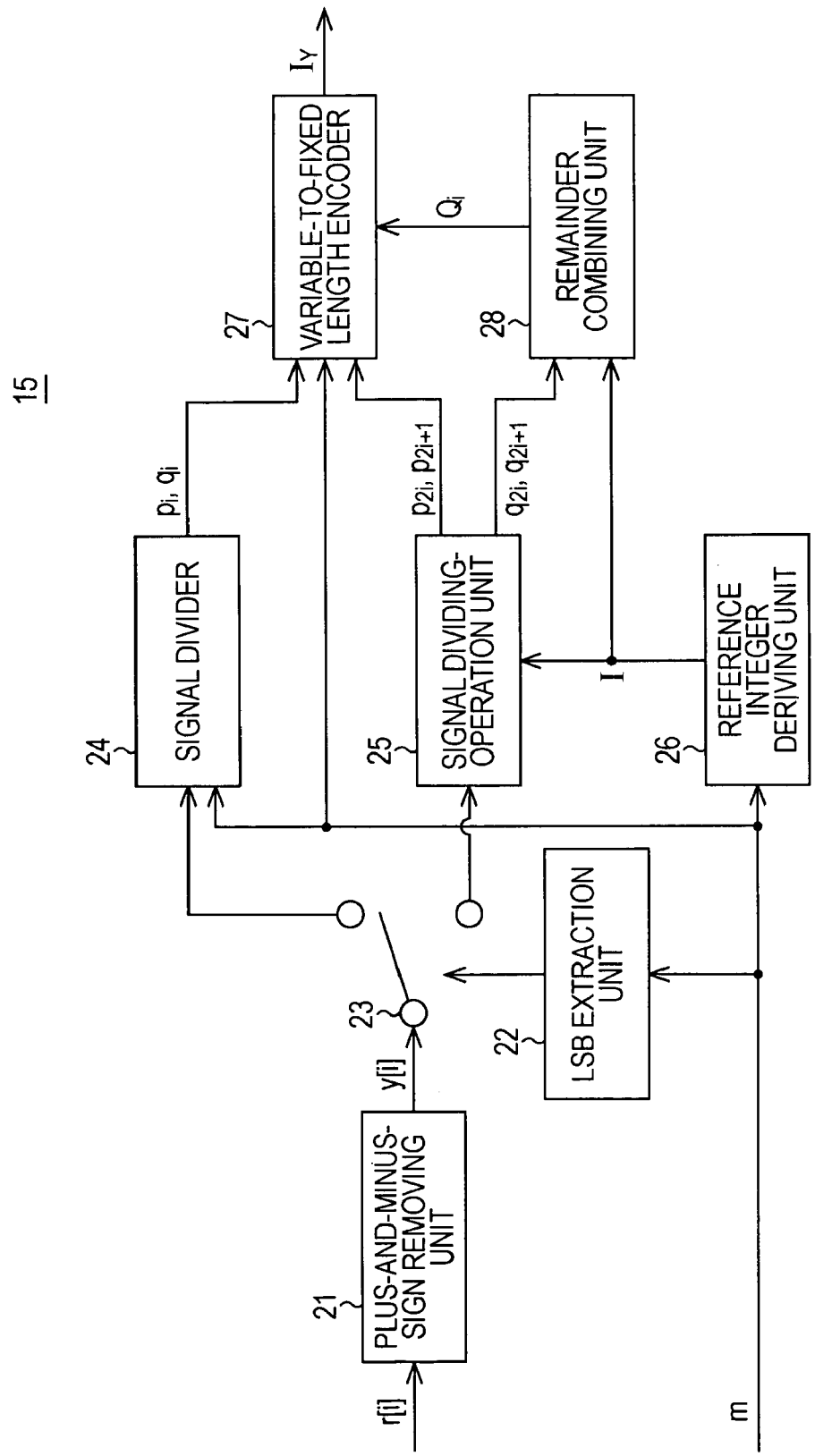
FIG. 2 is a block diagram showing the configuration of an entropy encoder.

Next, referring to FIG. 2, the entropy encoder 15 will be described in detail. FIG. 2 is a block diagram showing the configuration of the entropy encoder 15.

The entropy encoder 15 includes a plus-and-minus-sign removing unit 21 for converting the predicted residual signal r[i] into a signal y[i] with no plus and minus signs, an LSB extraction unit 22 for extracting the LSB (Least Significant Bit) of m, a switch 23 for switching the output destination of the signal y[i] with no plus and minus signs in accordance with the LSB of m, a signal dividing unit 24 for performing shift computation of the signal y[i] with no plus and minus signs on the basis of the bit position m/2 and for dividing the signal y[i] into high-order bits and low-order bits, a signal dividing-operation unit 25 for performing a dividing operation on the signal y[i] with no plus and minus signs using an integer I close to $2^{m/2}$, a reference integer deriving unit 26 for deriving an integer I close to $2^{m/2}$, a variable-to-fixed length encoder 27 for converting a quotient $p_i$ and a remainder $q_i$ in the signal dividing unit 24, quotient $p_{2i}$ and $p_{2i+1}$ in the signal dividing-operation unit 25, and a combined remainder $Q_i$ of the remainders $q_{2i}$ and $q_{2i+1}$ in the remainder combining unit 28 into a codeword $I_y$, and a remainder combining unit 28 for converting the remainders $q_{2i}$ and $q_{2i+1}$ into a combined remainder $Q_i$ in the signal dividing-operation unit 25.

The plus-and-minus-sign removing unit 21 converts the predicted residual signal r[i] into a signal y[i] with no plus and minus signs on the basis of expressions (3).

$$\begin{cases} y[i] = 2 \cdot r[i] & (r[i] \geq 0) \\ y[i] = -2 \cdot r[i] - 1 & (r[i] < 0) \end{cases} \qquad (3)$$

The LSB extraction unit 22 checks the least significant bit (LSB) as to whether the value of m is an even number or an odd number and extracts it. When m is 0, it is handled as an even number (hereinafter the same applies). When m is an even number, the switch 23 is switched so that the output destination of the signal y[i] with no plus and minus signs becomes the signal dividing unit 24. Furthermore, when m is an odd number, the switch 23 is switched so that the output destination of the signal y[i] with no plus and minus signs becomes the signal dividing-operation unit 25.

(1) When m is an Even Number

When m is an even number, that is, when the bit position m/2 is an integer, the signal y[i] with no plus and minus signs is input to the signal dividing unit 24. Here, since the right side of expression (2) becomes a squared integer of 2, it is set that m/2=m', and the value of the signal y[i] with no plus and minus signs is divided using $2^{m'}$, thereby determining a quotient $p_i$ and a remainder $q_i$. In practice, division of a signal is performed such that the signal y[i] with no plus and minus signs is shifted by m' bits to the right to determine a quotient $p_i$, and low-order m' bits are extracted to obtain a remainder $q_i$. The quotient $p_i$ and the remainder $q_i$ obtained by the signal dividing unit 24 are output to the variable-to-fixed length encoder 27.

$$\begin{cases} p_i = y[i] >> m' \\ q_i = y[i] \& (2^{m'} - 1) \end{cases} \quad (4)$$

The variable-to-fixed length encoder 27 performs variable-length-encoding of the quotient $p_i$, and performs fixed-length-encoding of the remainder $q_i$ using m' bits so as to convert them into a codeword $I_Y$.

As described above, when m is an even number, the quotient $p_i$ and the remainder $q_i$ are determined with regard to each signal y[0 ... N−1] with no plus and minus signs in order to convert them into a codeword $I_Y$.

(2) When m is an Odd Number

When m is an odd number, that is, when the bit position m/2 is a decimal fraction, the signal y[i] with no plus and minus signs is input to the signal dividing-operation unit 25. In the right side of expression (2), the reference integer deriving unit 26 derives an integer I that does not exceed m squared of √2.

$$I = \lfloor 2^{m/2} \rfloor \quad (5)$$

However, the integer I may be a value close to m squared of √2.

The signal dividing-operation unit 25 divides continuous signals y[2i] and y[2i+1] (i=0 ... N/2−1) with no plus and minus signs by using an integer I in order to obtain quotients $p_{2i}$ and $p_{2i+1}$ and remainders $q_{2i}$ and $q_{2i+1}$ on the basis of expressions (6). In the upper part and the lower part of expressions (6), the same integer I is used, but this is not necessarily necessary to be the same.

$$\begin{cases} p_{2i} = y[2 \cdot i]/I, & q_{2i} = y[2 \cdot i] \% I \\ p_{2i+1} = y[2 \cdot i + 1]/I, & q_{2i+1} = y[2 \cdot i + 1] \% I \end{cases} \quad (6)$$

The quotients $p_{2i}$ and $p_{2i-1}$ determined in expressions (6) are output to the variable-to-fixed length encoder 27, and the remainders $q_{2i}$ and $q_{2i+1}$ are output to the remainder combining unit 28. The quotients $p_{2i}$ and $p_{2i+1}$ output to the variable-to-fixed length encoder 27 are variable-length-encoded in the same manner as when m is an even number.

The remainder combining unit 28 combines the two values of the remainders $q_{2i}$ and $q_{2i+1}$ so as to be converted into a combined remainder $Q_i$. In view of the properties of a remainder, the remainders $q_{2i}$ and $q_{2i+1}$ do not exceed the integer I.

$$0 \leq q_{2i}, q_{2i+1} < I \quad (7)$$

On the basis of expression (7), the remainders $q_{2i}$ and $q_{2i+1}$ are converted into a combined remainder $Q_i$.

$$0 \leq Q_i = q_{2i} + I \cdot q_{2i+1} < I^2 < 2^m \quad (8)$$

This means that the combined remainder $Q_i$ in which the remainders $q_{2i}$ and $q_{2i+1}$ are combined can be stored within m bits. This combined remainder $Q_i$ is output to the variable-to-fixed length encoder 27.

The variable-to-fixed length encoder 27 performs variable-length-encoding of the quotients $p_{2i}$ and $p_{2i+1}$, performs fixed-length-encoding of the combined remainder $Q_i$ by using m bits, and generates and outputs a codeword $I_Y$.

When the bit position m/2 is a decimal fraction in the manner described above, the continuous signals y[2i] and y[2i+1] (i=0 ... N/2−1) with no plus and minus signs are divided by the integer I, obtaining the quotients $p_{2i}$ and $p_{2i+1}$ and the remainders $q_{2i}$ and $q_{2i+1}$ on the basis of expressions (6). The two values of the remainders $q_{2i}$ and $q_{2i+1}$ are combined and converted into a combined remainder $Q_i$, and the quotients $p_{2i}$ and $p_{2i+1}$ and the combined remainder $Q_i$ are converted into a codeword $I_Y$.

Figure 3:
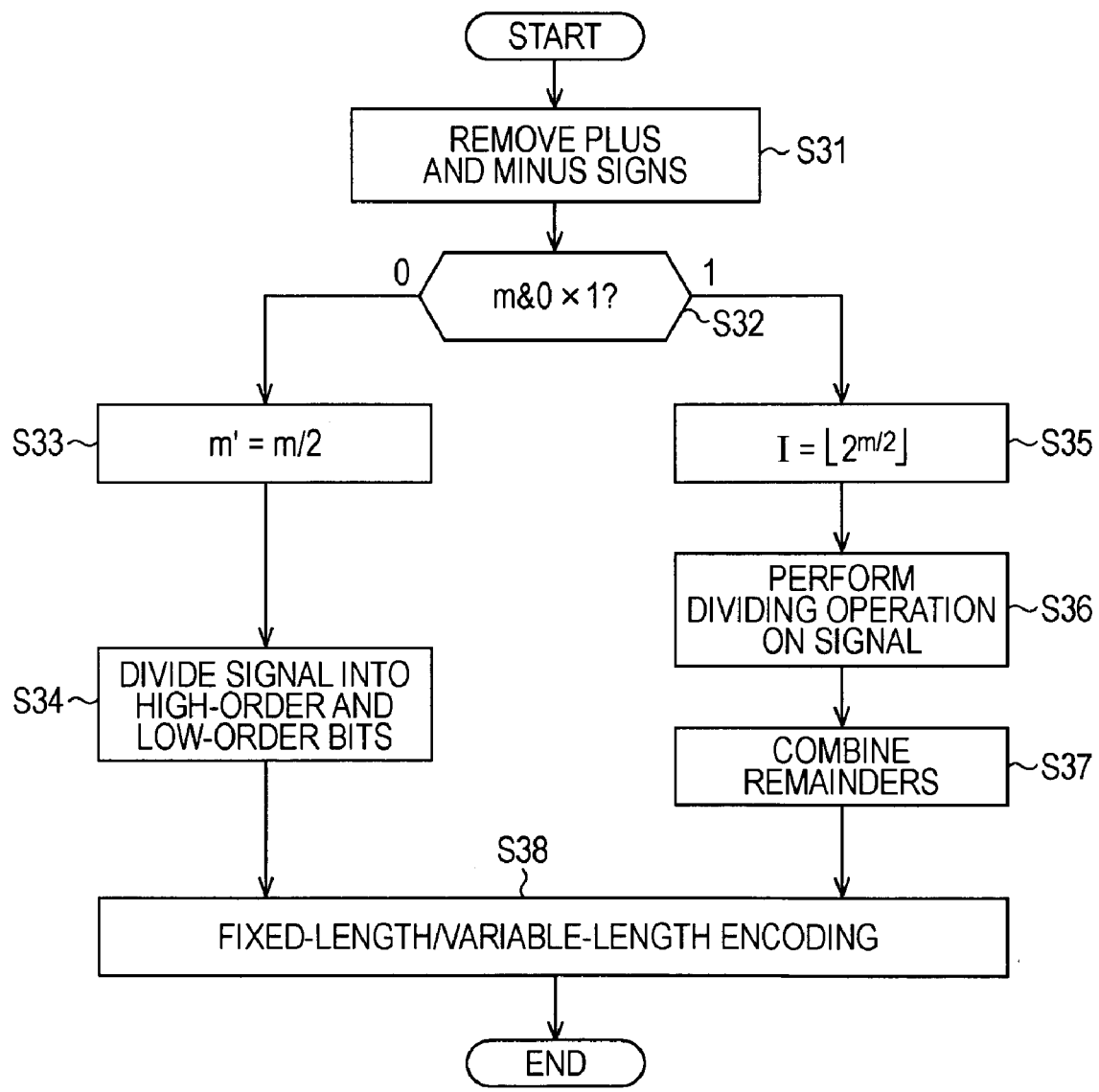
FIG. 3 is a flowchart showing processing of the entropy encoder.

Next, a description will be given, with reference to the flowchart shown in FIG. 3, of processing of the entropy encoder 15. In step S31, the plus-and-minus-sign removing unit 21 converts the predicted residual signal r[i] into a signal y[i] with no plus and minus signs on the basis of expression (3) above.

In step 32, the LSB extraction unit 22 determines whether or not the value of m is an even number or an odd number on the basis of the least significant bit (LSB). When m is an even number, that is, m is 0, the process proceeds to step S33, where the LSB extraction unit 22 switches the switch 23 so that the output destination of the signal y[i] with no plus and minus signs becomes the signal dividing unit 24. Furthermore, when m is an odd number, that is, m is 1, the process proceeds to step S35, where the LSB extraction unit 22 switches the switch 23 so that the output destination of the signal y[i] with no plus and minus signs becomes the signal dividing-operation unit 25.

When m is an even number, in step S33, the signal dividing unit 24 sets the bit position to m/2=m', and divides the value of the signal y[i] with no plus and minus signs using $2^{m+}$ in order to determine a quotient $p_i$ and a remainder $q_i$ (step S34), so that the signal is divided into high-order and low-order bits. The quotient $p_i$ and the remainder $q_i$ are output to the variable-to-fixed length encoder 27.

In step S38, the variable-to-fixed length encoder 27 performs variable-length-encoding of the quotient $p_i$, performs fixed-length-encoding of the remainder $q_i$ using m' bits, and converts them into a codeword $I_Y$.

Furthermore, when m is an odd number, in step S35, the reference integer deriving unit 26 derives an integer I that does not exceed m squared of √2 in the right side of expression (2).

In step S36, the signal dividing-operation unit 25 divides continuous signals y[2i] and y[2i+1] (i=0 ... N/2−1) with no plus and minus signs using the integer I, thereby obtaining quotients $p_{2i}$ and $p_{2i+1}$ and remainders $q_{2i}$ and $q_{2+1}$ on the basis of expressions (6) above.

In step S37, the remainder combining unit 28 combines the two values of the remainders $q_{2i}$ and $q_{2i+1}$ and converts them into a combined remainder $Q_i$.

In step S38, the variable-to-fixed length encoder 27 performs variable-length-encoding of the quotients $p_{2i}$ and $p_{2i+1}$, performs fixed-length-encoding of the combined remainder $Q_i$ by using m bits, and generates and outputs a codeword $I_Y$.

As described above, when m is an even number, the bit position is set to m/2=m', and the value of the signal y[i] with no plus and minus signs is divided by $2^{m'}$ in order to determine a quotient $p_i$ and a remainder $q_i$. When m is an odd number, continuous signals y[2i] and y[2i+1] (i=0 ... N/2−1) with no plus and minus signs are divided using an integer I close to $2^{m/2}$, and the two values of the remainders $q_{2i}$ and $q_{2i+1}$ are combined and converted into a combined remainder $Q_i$, making it possible to set the bit position at which a bit string is divided to ½ units and making it possible to improve encoding efficiency.

In the signal dividing-operation unit 25, division is performed using expressions (6) above. Alternatively, the reciprocal of the integer I shown in expression (5) above may be formed as a table in advance. As a result, the number of computations can be decreased.

A description will be given more specifically. The reciprocal of expression (5) above is represented by expression (9) below. Values I' and E corresponding to expression (9) may be formed as integers in the form of a table.

$$I' = \lfloor 2^E / I \rfloor \tag{9}$$

When expressions (6) are modified on the basis of expression (9), expressions (10) are obtained.

$$\begin{cases} p_{2i} = (y[2 \cdot i] \cdot I') >> E, & q_{2i} = y[2 \cdot i] - p_{2i} \cdot I \\ p_{2i+1} = (y[2 \cdot i + 1] \cdot I') >> E, & q_{2i+1} = y[2 \cdot i + 1] - p_{2i+1} \cdot I \end{cases} \tag{10}$$

As described above, if the values I' and E corresponding to expression (9) are formed as integers in the form of a table, it is possible to determine the values without performing a dividing operation or calculation of a remainder. In general, when division becomes necessary, the number of computations is increased. In the manner described above, by prestoring an integer corresponding to the reciprocal of the integer I, multiplication can be used, making it possible to decrease the number of computations.

Furthermore, by correcting expressions (10) above, it is possible to prevent an influence due to the formation of expression (9) into an integer. As in expression (7), the remainders $q_{2i}$ and $q_{2i+1}$ are greater than or equal to 0 and less than the integer I. In the computation of the remainders $q_{2i}$ and $q_{2i+1}$ of expressions (10), there is a possibility that they become greater than or equal to the integer I. In that case, a correction computation of expressions (11) below is performed.

$$\begin{cases} q_i < 0 & \rightarrow & p_i \mathrel{-}= 1, \quad q_i \mathrel{+}= I \\ q_i \geq I & \rightarrow & p_i \mathrel{+}= 1, \quad q_i \mathrel{-}= I \end{cases} \tag{11}$$

Here, since the same processing is performed for both 2i and 2i+1, 2i and 2i+1 are set to i. For the correction computation, when the remainder $q_i$ is less than 0, with respect to the subtraction of 1 from the quotient $p_i$, the integer I is added to the remainder $q_i$. When the remainder $q_i$ is greater than or equal to the integer I, with respect to the addition of 1 to the quotient $p_i$, the integer I is subtracted from the remainder $q_i$. As a result, as in expression (7), the remainders $q_{2i}$ and $q_{2i+1}$ can be set to be greater than or equal to 0 and less than the integer I, thereby improving encoding efficiency.

Furthermore, in a case where a threshold value M is set for m and m is greater than the threshold value M, that is, the number of bits x (x=m/2) from the least significant bit is a decimal fraction and is greater than a predetermined threshold value X (X=m/2), the signal y[i] with no plus and minus signs may be divided in advance into a low-order (m−M)/2 bit $t_i$ and a high-order bit y'[i] higher than that.

$$t_i = y[i] \& (2^{(m-M)/2} - 1), \quad y'[i] = y[i] >> ((m-M)/2) \tag{12}$$

The low-order bit $t_i$ obtained in this manner is sent as data of a (m−M)/2 bit length to the multiplexer 18, where the high-order bit y'[i] is subjected to a conversion process by setting m=M in expressions (6) or expressions (10). As a consequence, it is not necessary to provide a table of values corresponding to the reciprocal of the integer I more than necessary.

Decoding Process

Figure 4:
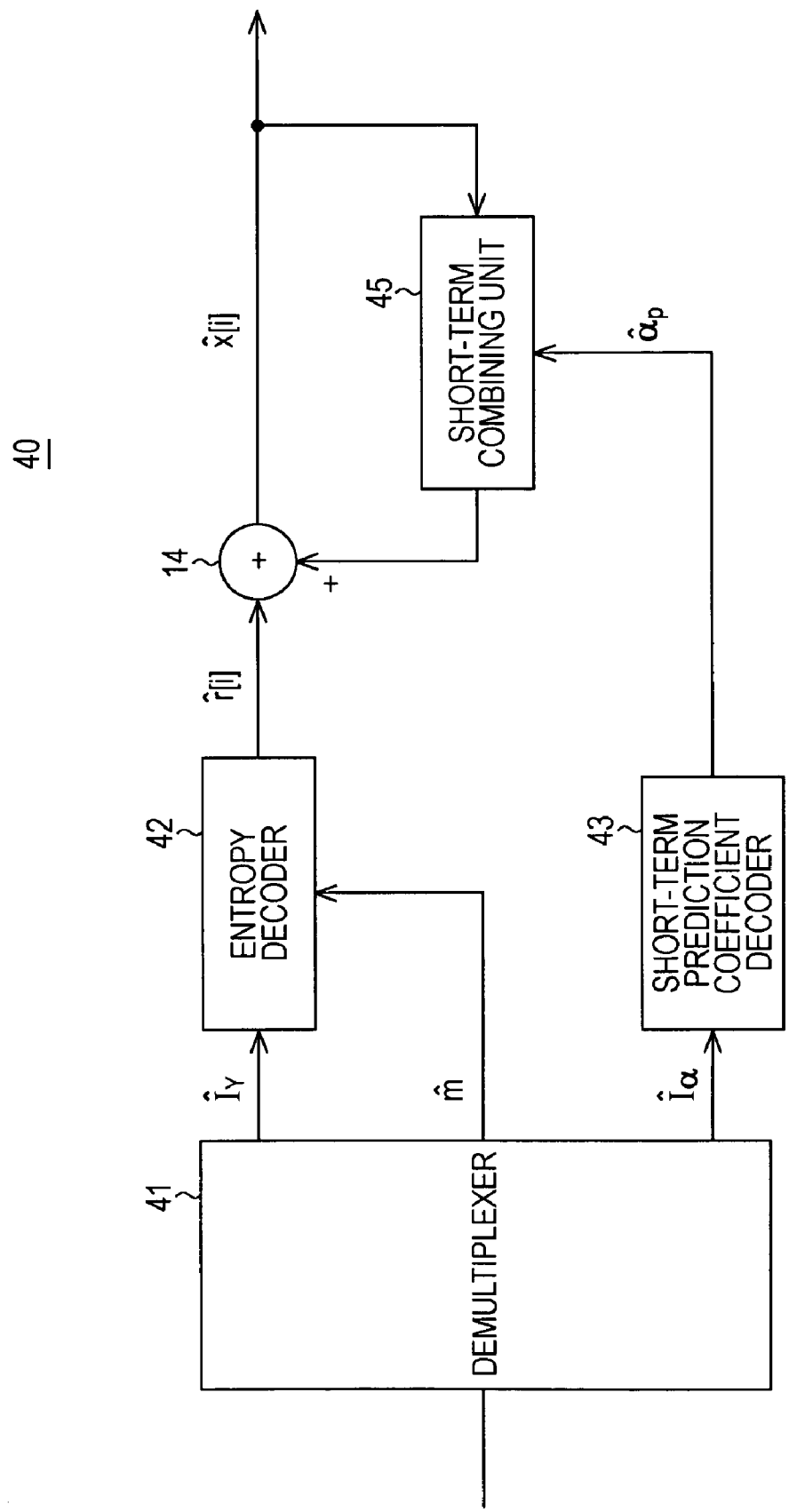
FIG. 4 is a block diagram showing the configuration of a decoder.

A process for decoding the above-described encoded data will be described below. FIG. 4 is a block diagram showing the configuration of a decoder. A decoder 40 includes a demultiplexer 41 for demultiplexing multiplexed data so as to be decoded to a codeword $I_Y$, a reference bit position m/2, and a codeword $I_\alpha$, an entropy decoder 42 for converting the codeword $I_Y$ into a predicted residual signal r[i] on the basis of the reference bit position m/2, a short-term prediction coefficient decoder 43 for converting the codeword $I_\alpha$ into a short-term prediction coefficient $\alpha_p$, an adder 44 for computing an audio signal x[i] from a past audio signal in which correlations between the predicted residual signal r[i] and samples are combined, and a short-term combining unit 45 for generating an audio signal in which correlations between proximity samples are combined on the basis of the short-term prediction coefficient $\alpha_p$.

The multiplexed data input to the demultiplexer 41 is demultiplexed so as to be decoded to individual codewords. The codeword $I_Y$ and the bit position m/2 decoded by the demultiplexer 41 are input to the entropy decoder 42 for decoding the decoding residual signal r[i].

The codeword $I_\alpha$ of the short-term prediction coefficient is decoded by the short-term prediction coefficient decoder 43, generating a short-term prediction coefficient $\alpha_p$, and this is sent to the short-term combining unit 45. In the adder 44 and the short-term combining unit 45, an audio signal x[i] is generated on the basis of the short-term prediction coefficient $\alpha_p$ and the past decoded signal in accordance with expression (13).

$$\hat{x}[i] = \hat{r}[i] + \sum_{p=1}^{P} \hat{\alpha}_p \cdot \hat{x}[i-p] \tag{13}$$

In the manner described above, it becomes possible to decode the signal in a lossless manner.

Figure 5:
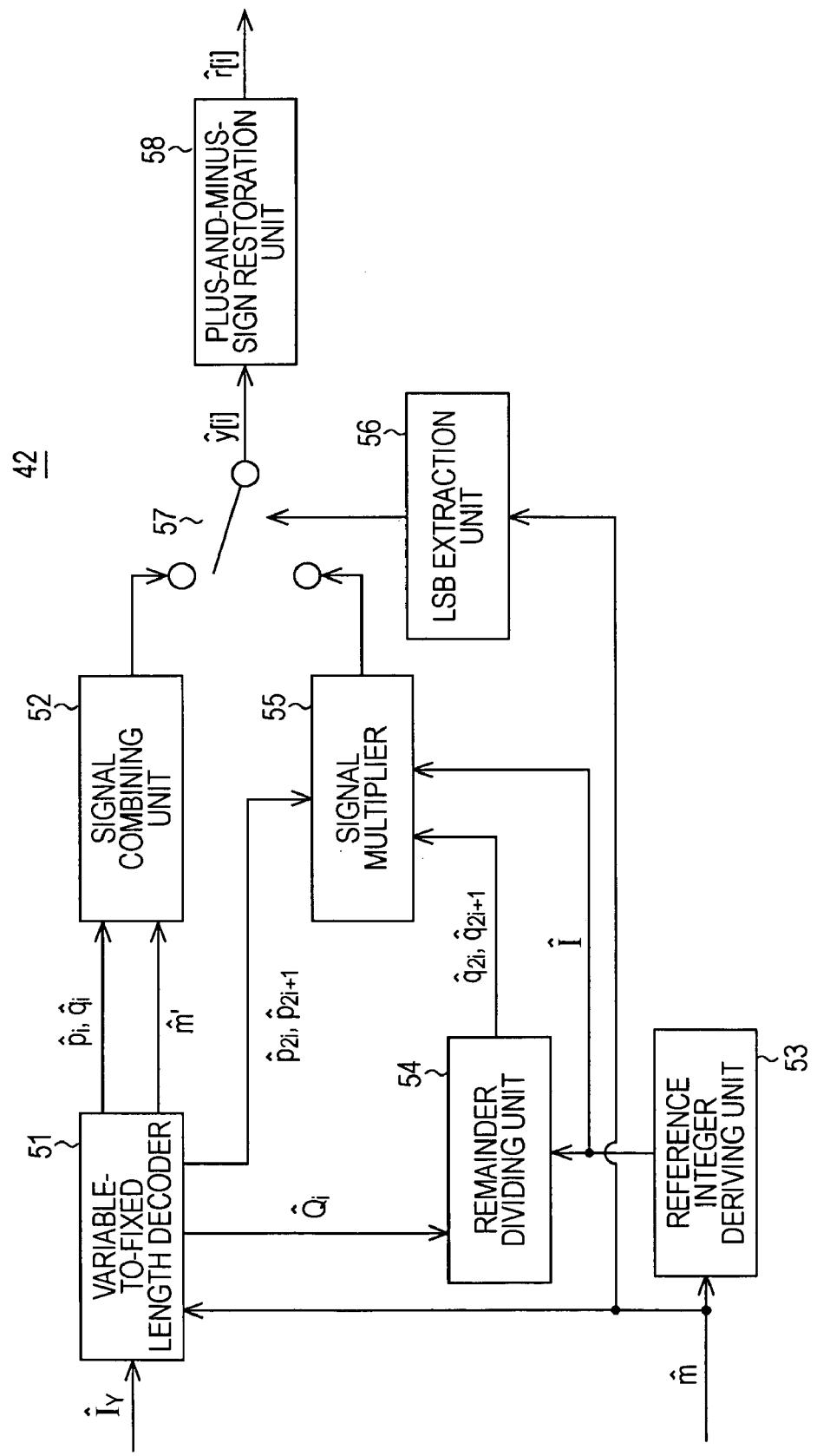
FIG. 5 is a block diagram showing the configuration of an entropy decoder.

Next, the entropy decoder 42 will be described in detail with reference to FIG. 5. FIG. 5 is a block diagram showing the configuration of the entropy decoder 42.

The entropy decoder 42 includes a variable-to-fixed length decoder 51 for determining whether m is an even number or an odd number and for converting a codeword $I_Y$ into a quotient $p_i$ and a remainder $q_i$ or into quotients $p_{2i}$ and $p_{2i+1}$ and a combined remainder $Q_i$, a signal combining unit 52 for combining high-order bits and low-order bits on the basis of m with respect to the quotient $p_i$ and the remainder $q_i$ in order to generate a signal y[i] with no plus and minus signs, a reference integer deriving unit 53 for deriving an integer I close to m squared of √2, a remainder dividing unit 54 for decoding the remainders $q_{2i}$ and $q_{2i+1}$ from the combined remainder $Q_i$, a signal multiplier 55 for decoding signals y[2i] and y[2i+1] with no plus and minus signs from the quotients $p_{2i}$ and $p_{2i+1}$, the remainders $q_{2i}$ and $q_{2i+1}$, and m, an LSB extraction unit 56 for extracting the least significant bit (LSB) of m, a switch 57 for switching the output source of the signal y[i] with no plus and minus signs in accordance with the LSB of m, and a plus-and-minus-sign restoration unit 58 for converting the signal y[i] with no plus and minus signs into a decoded residual signal r[i].

(1) When m is an Even Number

When m is an even number, that is, when the bit position m/2 is an integer, by setting m/2=m', the variable-to-fixed-length decoder 51 converts the input codeword $I_Y$ into a quotient $p_i$ and a remainder $q_i$. Since m' is an integer, the signal combining unit 52 performs a shift operation for each sample in order to decode a signal y[i] with no plus and minus signs.

$$\hat{y}[i]=(\hat{p}_i<<\hat{m}')|\hat{q}_i \qquad (14)$$

(2) When m is an Odd Number

When the bit position m is an odd number, that is, when the bit position m/2 is a decimal fraction, the variable-to-fixed length decoder 51 converts the input codeword $I_Y$ into quotients $p_{2i}$ and $p_{2i+1}$ and a combined remainder $Q_i$. Since m/2 is a decimal fraction, the signals y[2i] and y[2i+1] (i=0 . . . N/2−1) with no plus and minus signs are decoded collectively for two samples.

The reference integer deriving unit 53 determines the integer I close to m squared of √2 on the basis of expression (15). If the integer I is determined by the same method as that of the encoder 10, another method may be used.

$$\hat{I}=\lfloor 2^{m'/2} \rfloor \qquad (15)$$

The remainder dividing unit 54 decodes the remainders $q_{2i}$ and $q_{2i+1}$ from the combined remainder $Q_i$ by using expressions (16) below.

$$\begin{cases} \hat{q}_{2i+1} = \hat{Q}_i / \hat{I} \\ \hat{q}_{2i} = \hat{Q}_i - \hat{q}_{2i+1} \cdot \hat{I} \end{cases} \qquad (16)$$

The signal multiplier 55 decodes the signals y[2i] and y[2i+1] (i=0 . . . N/2−1) on the basis of the quotients $p_{2i}$ and $p_{2i+1}$, the remainders $q_{2i}$ and $q_{2i+1}$, and the integer I by using expressions (17).

$$\begin{cases} \hat{y}[2 \cdot i] = \hat{p}_{2i} \cdot \hat{I} + \hat{q}_{2i} \\ \hat{y}[2 \cdot i + 1] = \hat{p}_{2i+1} \cdot \hat{I} + \hat{q}_{2i+1} \end{cases} \qquad (17)$$

The LSB extraction unit 56 extracts the least significant bit (LSB) of m in order to determine whether m is an even number. Then, when m is an even number, the LSB extraction unit 56 causes the switch 57 to be connected to the upper part so that the output source of the signal y[i] with no plus and minus signs becomes the signal combining unit 52. When m is an odd number, the LSB extraction unit 56 causes the switch 57 to be connected to the lower part so that the output source of the signals y[2i] and y[2i+1] (i=0 . . . N/2−1) with no plus and minus signs becomes the signal multiplier 55.

The plus-and-minus-sign restoration unit 58 converts the signal y[i] with no plus and minus signs into a decoded residual signal r[i] on the basis of expressions (18).

$$\begin{cases} \hat{r}[i] = \hat{y}[i] >> 1, & ((\hat{y}[i] \& 0x1) == 0) \\ \hat{r}[i] = \sim(\hat{y}[i] >> 1), & ((\hat{y}[i] \& 0x1) == 1) \end{cases} \qquad (18)$$

That is, when the least significant bit of the signal y[i] with no plus and minus signs is 1, the signal is shifted by one bit to the right and thereafter, bit inversion is performed. When the least significant bit is 0, shifting by one bit to the right only is performed so that the plus and minus signs are restored.

Next, the processing of the entropy decoder 42 will be described with reference to the flowchart shown in FIG. 6. In step S61, the variable-to-fixed-length decoder 51 decodes the codeword $I_Y$ and determines whether or not m is an even number or an odd number (step S62).

When m is an even number, the process proceeds to step S63, where the bit position is set to m/2=m', and the signal combining unit 52 combines the high-order bits and the low-order bits in order to decode the signal y[i] with no plus and minus signs (step S64).

When m is an odd number, the process proceeds to step S65, where the reference integer deriving unit 53 derives an integer I close to m squared of √2. In step S66, the remainder dividing unit 54 decodes the remainders $q_{2i}$ and $q_{2i+1}$ from the combined remainder $Q_i$ on the basis of expressions (16) by using the integer I. In step S67, the signals y[2i] and y[2i+1] (i=0 . . . N/2−1) are decoded from the quotients $p_{2i}$ and $p_{2i+1}$, the remainders $q_{2i}$ and $q_{2i+1}$, and the integer I on the basis of expressions (17).

In step S68, the plus-and-minus-sign restoration unit 58 converts the signal y[i] with no plus and minus signs into a decoded residual signal r[i] on the basis of expressions (18).

In the manner described above, when m is an even number, the bit position is set to m/2=m', the high-order bits and the low-order bits are combined, and the signal y[i] with no plus and minus signs is decoded. When m is an odd number, by using the integer I, the remainders $q_{2i}$ and $q_{2i+1}$ are decoded from the combined remainder $Q_i$, and the signals y[2i] and y[2i+1] (i=0 . . . N/2−1) with no plus and minus signs are decoded from the quotients $p_{2i}$ and $p_{2i+1}$, the remainders $q_{2i}$ and $q_{2i+1}$, and the integer I, making it possible to perform decoding in which the bit position is set in ½ units.

In the remainder dividing unit 54, division is used. Alternatively, multiplication can also be used by forming in advance as a table a value I' corresponding to the reciprocal of the integer I as in expression (19).

$$\hat{I}'=\lfloor 2^{\hat{E}}/\hat{I} \rfloor \qquad (19)$$

Furthermore, the first expression of expressions (16) can be changed from expression (19) to expression (20).

$$\hat{q}_{2i+1}=(\hat{Q}_i T)>>\hat{E} \qquad (20)$$

Furthermore, since the value I' represented by expression (19) is formed as an integer, when an error occurs, it is preferable that correction represented by expressions (21) below be performed.

$$\begin{cases} \hat{q}_{2i} < 0 \rightarrow \hat{q}_{2i+1} -= 1, \ \hat{q}_{2i} += \hat{I} \\ \hat{q}_{2i} \geq \hat{I} \rightarrow \hat{q}_{2i+1} += 1, \ \hat{q}_{2i} -= \hat{I} \end{cases} \quad (21)$$

In a case where a threshold value M is set for m in the encoder and the signal y[i] with no plus and minus signs is divided into a low-order (m−M)/2 bit $t_i$ and a high-order bit y'[i] higher than that, if m is greater than the predetermined threshold value M, $t_i$ is decoded from the codeword obtained from the demultiplexer 41. That is, in a case where the number of bits x from the least significant bit is a decimal fraction and is greater than a predetermined threshold value X (X=m/2, M is a positive odd number), by setting the number of bits as x=X, a high-order bit string y'[i] is generated, and data of a (m−M)/2 bit length is fixed-length-decoded, thereby generating a low-order bit string $t_i$. More specifically, after the result determined by replacing m in expressions (15) to (17) above with M is set as y'[i], y[i] is decoded by using expression (22).

$$\hat{y}[i] = (\hat{y}'[i]) << ((\hat{m}'-M)/2))|t_i \quad (22)$$

Generalized Embodiment

In the above-described encoding method, a case of n=2, in which the bit position from the least significant bit is virtually set to m/2, has been described. Here, a generalized encoding method in which n exceeds 2 will be described. In this case, m will be determined as in the following expression.

$$\frac{\sum_{i=0}^{N-1} |r[i]|}{N} \leq \lfloor 2^{m/n} \rfloor \quad (23)$$

Then, in a case where m/n is an integer, Golomb-Rice encoding is performed as in the related art. However, in a case where m/n is a decimal fraction, an integer I is introduced as shown below.

$$I = \lfloor 2^{m/n} \rfloor \quad (24)$$

At this point, the signals y[n·i] and y[n·i+1] ... y[n·i+n−1] with no plus and minus signs are decomposed as shown below.

$$p_{n \cdot i+k} = y[n \cdot i+k]/I, \ q_{n \cdot i+k} = y[n \cdot i+k] \% I \ (0 \leq k < n) \quad (25)$$

Furthermore, the combined remainder $Q_i$ is determined from the remainder $q_{n \cdot i+k}$.

$$\begin{cases} Q_{i,0} = q_{n \cdot i+0} \\ Q_{i,k} = Q_{i,k-1} \cdot I + q_{n \cdot i+k} \ (k=1, \ldots, n-1) \\ Q_i = Q_{i,n-1} \end{cases} \quad (26)$$

For the above, when k=0, the remainder $q_{n \cdot i+0}$ is substituted in the combined remainder $Q_{i,0}$, and the remainder $q_{n \cdot i+k}$ is added while the combined remainder $Q_{i,k-1}$ is multiplied by I times in sequence starting from k=1.

On the other hand, in the decoding, conversely, a remainder $q_{n \cdot i+k}$ is determined from the combined remainder Q in accordance with the following expression.

$$\begin{cases} \hat{Q}_{i,n-1} = \hat{Q}_i \\ \hat{Q}_{i,k-1} = \hat{Q}_{i,k}/\hat{I}, \ \hat{q}_{n \cdot i+k} = \hat{Q}_{i,k} - \hat{Q}_{i,k-1} \cdot \hat{I} \ (k=n-1, \ldots, 1) \\ \hat{q}_{n \cdot i+0} = \hat{Q}_{i,0} \end{cases} \quad (27)$$

In the manner described above, by virtually setting the bit position from the least significant bit to m/n, the signal is subdivided. Therefore, it is possible to allocate an appropriate number of bits into the high-order bits or the low-order bits with respect to the distribution of the signal, thereby making it possible to improve encoding efficiency.

The present invention is not limited to only the above-described embodiments. Of course, various changes are possible within the spirit and scope of the present invention. For example, in the above-described embodiments, the present invention has been described as the configuration of hardware, but is not limited to this. Any desired processing can be realized by causing a central processing unit (CPU) to execute a computer program. In this case, the computer program can be provided in such a manner as to be recorded on a recording medium and also, can be provided by being transmitted via a transmission medium, such as the Internet.

Specific Example of Encoding

Next, the above-described entropy encoding method will be described below by using a specific example. Here, in the cases of m=8 and m=9, which are determined from an input signal r[0, ..., and N−1] in the reference value deriving unit 16, r[2i]=−19 and r[2i+1]=7 are to be encoded.

The quotients $p_i$ in expressions (4) and (6) are assumed to be variable-length-encoded in the variable-to-fixed length encoder 27 as shown in an encoding table shown in Table 1.

TABLE 1

| | Encoding Table | |
|---|---|---|
| $p_i$ | Codeword | Code Length [bit] |
| 0 | 1 | 1 |
| 1 | 01 | 2 |
| 2 | 001 | 3 |
| 3 | 0001 | 4 |

The predicted residual signals r[2i] and r[2i+1] are converted into a signal y[i] with no plus and minus signs on the basis of expression (3).

$$\begin{cases} y[2 \cdot i] = -2 \cdot (-19) - 1 = 37 \\ y[2 \cdot i+1] = 2 \cdot 7 = 14 \end{cases}$$

At this point, when m=8, since m'=m/2=4, y[i] is divided as shown below on the basis of expressions (4).

$$\begin{cases} p_{2i} = 37 >> 4 = 2, \quad q_{2i} = 37 \ \& \ 15 = 5 = 0b0101 \\ p_{2i+1} = 14 >> 4 = 0, \quad q_{2i+1} = 14 \ \& \ 15 = 14 = 0b1110 \end{cases}$$

Therefore, the codeword $I_Y$ for these two samples becomes as, for example, the following on the basis of Table 1, and is represented using a total of 12 bits in which r[2i] is 7 bits and r[2i+1] is 5 bits.

$$I_Y = (0b001, 0b0101, 0b1, 0b1110)$$

Furthermore, when m=9, since the integer I=22 is satisfied on the basis of expression (5), a dividing operation is performed on y[2i] and y[2i+1] on the basis of expressions (6).

$$\begin{cases} p_{2i} = 37/22 = 1, & q_{2i} = 37\%22 = 15 \\ p_{2i+1} = 14/22 = 0, & q_{2i+1} = 14\%22 = 14 \end{cases}$$

Furthermore, the combined remainder $Q_i$ is determined on the basis of expression (8).

$Q_i$=15+22·14=323=0b101000011

Therefore, the codeword $I_Y$ for these two samples becomes as, for example, the following on the basis of Table 1, and r[2i] and r[2i+1] are represented using a total of 12 bits.

$I_Y$=(0b01, 0b1, 0b1010000111)

Specific Example of Decoding

Next, a procedure for decoding the above-described codeword of two samples will be described. When the term of the quotient $p_i$ of Table 1 and the term of the codeword $I_Y$ are viewed, the number of 0s until 1 of the codeword appears matches the value of the quotient $p_i$, and by using this, the quotient $p_i$ is determined from the codeword.

When m=8, since the codeword $I_Y$ of the quotient $p_{2i}$ has two bits of 0 until 1 appears at first, the quotient $p_{2i}$=2 is determined, and the remainder $q_{2i}$=5 is determined by the following 4 bits. Similarly, in the codeword $I_Y$ of the quotient $p_{2i+1}$, since 1 appears immediately after, the quotient $p_{2i+1}$=0 is determined, and the remainder $q_{2i+1}$=14 is determined by the following 4 bits. Then, y[2i] and y[2i+1] are decoded on the basis of expressions (17) above.

$$\begin{cases} \hat{y}[2 \cdot i] = (2 << 4) | 5 = 37 \\ \hat{y}[2 \cdot i + 1] = (0 << 4) | 14 = 14 \end{cases}$$

Furthermore, when m=9, since there is 1-bit 0 in the codeword $I_Y$ until 1 appears at first, a quotient $p_{2i}$=1 is determined. Since 1 appears immediately after, a quotient $p_{2i+1}$=0 is determined, and $Q_i$=323 is determined by the following 4 bits. Since I=22 on the basis of expression (15), the remainders $q_{2i}$ and $q_{2i+1}$ are decoded on the basis of expressions (16).

$$\begin{cases} \hat{q}_{2i+1} = 323/22 = 14 \\ \hat{q}_{2i} = 323 - 14 \cdot 22 = 15 \end{cases}$$

Then, y[i] is decoded on the basis of expressions (17).

$$\begin{cases} \hat{y}[2 \cdot i] = 1 \cdot 22 + 15 = 37 \\ \hat{y}[2 \cdot i + 1] = 0 \cdot 22 + 14 = 14 \end{cases}$$

Furthermore, the decoding residual signals r[2i]=−19 and r[2i+1]=7 are decoded on the basis of expressions (18).

Specific Example of Processing in a Case where Threshold Value M is Set for m

A description will be given of encoding in a case where m=29 when a threshold value M=27. At this point, when, with regard to predicted residual signals r[2·i]=79680 and r[2·i+1]= −137735, a signal with no plus and minus signs is determined on the basis of expression (3), y[2·i]=159360 and y[2·i+1]=275469 are obtained.

The integer I is determined on the basis of expression (5).

I=$\lfloor 2^{M/2} \rfloor$=$\lfloor 2^{27/2} \rfloor$=11585

Furthermore, the signal is divided into the high-order bits and the low-order bits on the basis of expression (12) above. At this point, the low-order bit is (m−M)/2=1 bit.

$$\begin{cases} t_{2 \cdot i} = y[2 \cdot i] \& 0x1 = 0, & y'[2 \cdot i] = y[2 \cdot i] >> 1 = 79680 \\ t_{2 \cdot i+1} = y[2 \cdot i + 1] \& 0x1 = 1, & y'[2 \cdot i + 1] = y[2 \cdot i + 1] >> 1 = 137734 \end{cases}$$

The quotients $p_{2i}$ and $p_{2i\,1}$ and the remainders $q_{2i}$ and $q_{2i+1}$ are calculated on the basis of expressions (6).

$$\begin{cases} p_{2i} = y'[2 \cdot i]/I = 6, & q_{2i} = y'[2 \cdot i]\% \ I = 10170 \\ p_{2i+1} = y'[2 \cdot i + 1]/I = 11, & q_{2i+1} = y[2 \cdot i + 1]\% \ I = 10299 \end{cases}$$

The combined remainder $Q_i$ is obtained as 27-bit data on the basis of expression (8).

$Q_i$=$q_{2 \cdot i}$+I·$q_{2 \cdot i+1}$=10170+11585*10299=119324085

In the manner described above, the following five variables are determined.

$(p_{2 \cdot i}, p_{2 \cdot i+1}, Q_i, t_{2 \cdot i}, t_{2 \cdot i+1})$=(6, 11, 119324085, 0, 1)

Next, a process for decoding the five variables will be described below. First, an integer I is determined on the basis of m (=29>M) obtained from a bit stream.

$\hat{I}$=$\lfloor 2^{M/2} \rfloor$=$\lfloor 2^{27/2} \rfloor$=11585

Remainders $q_{2i}$ and $q_{2i+1}$ are determined from the combined remainder $Q_i$ on the basis of expressions (16).

$$\begin{cases} \hat{q}_{2i+1} = \hat{Q}_i / \hat{I} = 119324085/11585 = 10299 \\ \hat{q}_{2i} = \hat{Q}_i - \hat{q}_{2i+1} \cdot \hat{I} = 119324085 - 10299 \cdot 11585 = 10170 \end{cases}$$

Signals y'[2i] and y'[2i+1] with no plus and minus signs are determined on the basis of expressions (17).

$$\begin{cases} \hat{y}'[2 \cdot i] = \hat{p}_{2i} \cdot \hat{I} + \hat{q}_{2i} = 6 \cdot 11585 + 10170 = 79680 \\ \hat{y}'[2 \cdot i + 1] = \hat{p}_{2i+1} \cdot \hat{I} + \hat{q}_{2i+1} = 11 \cdot 11585 + 10299 = 137734 \end{cases}$$

The signals y[2i] and y[2i+1] with no plus and minus signs are decoded using the low-order bits $t_{2i}$ and $t_{2i+1}$ (here, 1 bit) on the basis of expression (22).

$$\begin{cases} \hat{y}[2 \cdot i] = (\hat{y}'[2 \cdot i] << 1) | \hat{t}_{2 \cdot i} = (79680 << 1) | 0 = 159360 \\ \hat{y}[2 \cdot i + 1] = (\hat{y}'[2 \cdot i + 1] << 1) | \hat{t}_{2 \cdot i+1} = (137734 << 1) | 1 = 275469 \end{cases}$$

Plus and minus signs are decoded on the basis of expressions (18) in order to obtain r[2·i]=79680 and r[2·i+1]=−137735 on the basis of expressions (18).

APPLICATION EXAMPLE 1 OF THE PRESENT INVENTION

The present invention can be applied to lossless compression technology for a 44 kHz, 16-bit or 96 kHz 24-bit stereo sound source. Here, compression efficiency in a case of the related art in which Golomb-Rice encoding is applied and in a case in which the present invention is applied were verified.

Table 2 shows results in which compression efficiency was measured using a 44 kHz, 16-bit stereo sound source for approximately 10 to 30 seconds. The compression efficiency (ratio) was defined on the basis of the following expression.

$$\text{ratio} = \frac{\text{original\_file\_size} - \text{compressed\_file\_size}}{\text{original\_file\_size}} \times 100[\%]$$

Here, original_file_size is the file size of the original sound, and compressed_file_size is the size of a compressed file. It is shown that the higher the ratio, the higher the compression efficiency.

TABLE 2

Comparison of Compression Efficiency Between Proposed Method and Method of Related Art

| Sound Source File | Performance Time Period [Seconds] | Ratio Proposed Method [%] | Ratio Method of Related Art [%] | Difference [%] |
|---|---|---|---|---|
| Sound Source 1 | 10 | 61.893 | 61.821 | 0.072 |
| Sound Source 2 | 20 | 42.594 | 42.472 | 0.122 |
| Sound Source 3 | 20 | 47.202 | 47.080 | 0.122 |
| Sound Source 4 | 20 | 43.887 | 43.771 | 0.116 |
| Sound Source 5 | 20 | 37.455 | 37.310 | 0.145 |
| Sound Source 6 | 20 | 62.047 | 62.008 | 0.309 |
| Sound Source 7 | 30 | 40.847 | 40.723 | 0.124 |
| Total | 140 | 47.523 | 47.419 | 0.104 |

As shown in Table 2, by applying the present invention, the compression efficiency can be improved by 0.1% or more. Increases in the number of computations of the decoder as a result of the application of the present invention are approximately 0.3 to 0.5 MIPS at fs=44.1 kHz and 0.7 to 1.0 MIPS at fs=96 kHz, which are very small.

APPLICATION EXAMPLE 2 OF THE PRESENT INVENTION

Next, an example of advantages when the present invention is applied will be verified. Here, with respect to a certain frame of a target signal formed of 44.1 kHz, 16-bit N=2048 samples, variable-length encoding and fixed length encoding in cases in which m determined from expression (2) is 24 (m/2=12) in the value of Golomb-Rice encoding of the related art and is 23 (m/2=11.5) in the proposed method will be verified.

Table 3 shows a frequency distribution determined with regard to a quotient $p_i$ for 2048 samples on which variable-length encoding is performed. It is assumed here that, similarly to Golomb-Rice encoding, the bit length of the codeword of the quotient $p_i$ is $p_i$+1 bits.

TABLE 3

Comparison of Number of Bits of Variable-Length Encoding of Certain Frame

| | | Proposed Method (m = 23) | | Related Art (m = 24) | |
|---|---|---|---|---|---|
| pi | Bit Length | Frequency | Each Number of Bits | Frequency | Each Number of Bits |
| 0 | 1 | 1228 | 1228 | 1388 | 1388 |
| 1 | 2 | 327 | 654 | 326 | 652 |
| 2 | 3 | 186 | 558 | 176 | 528 |
| 3 | 4 | 130 | 520 | 92 | 368 |
| 4 | 5 | 75 | 375 | 39 | 195 |
| 5 | 6 | 48 | 288 | 17 | 102 |
| 6 | 7 | 24 | 168 | 7 | 49 |
| 7 | 8 | 17 | 136 | 1 | 8 |
| 8 | 9 | 7 | 63 | 0 | 0 |
| 9 | 10 | 3 | 30 | 1 | 10 |
| 10 | 11 | 1 | 11 | 1 | 11 |
| 11 | 12 | 0 | 0 | 0 | 0 |
| 12 | 13 | 0 | 0 | 0 | 0 |
| 13 | 14 | 0 | 0 | 0 | 0 |
| 14 | 15 | 2 | 30 | 0 | 0 |
| 15 | 16 | 0 | 0 | 0 | 0 |
| Total | | 2048 | 4061 | 2048 | 3311 |

When the number of bits of fixed length encoding is added to this, since m/2=12 in the related art, 3311+2048·12=27887 bits is reached. On the other hand, in the proposed method, since m/2=11.5, 4061+2048·11.5=27613 bits is reached, and 274 bits (0.84%) can be saved in this frame. It should be understood by those skilled in the art that various modifications, combinations, sub-combinations and alterations may occur depending on design requirements and other factors insofar as they are within the scope of the appended claims or the equivalents thereof.

What is claimed is:

1. An encoding method for dividing a bit string of an input signal at a position of x bits from a least significant bit into a high-order bit string and a low-order bit string, performing variable-length-encoding of the high-order bit string, and performing fixed-length-encoding of the low-order bit string, the encoding method comprising the steps of:
   determining whether an integer m of 0 or more is even or odd;
   when m is even, setting a reference integer I to $2^x$ (x=m/2);
   when m is odd, deriving the reference integer I close to $2^x$;
   obtaining a quotient and a remainder that are determined by performing a dividing operation on numerical values represented respectively by the bit strings by using the reference integer I; and
   performing variable-length-encoding of each of quotients of two consecutive bit strings, combining remainders corresponding to the quotients and performing fixed-length-encoding of the result, and generating a codeword.

2. The encoding method according to claim 1, wherein, in the obtaining step, the numerical values are multiplied by an integer corresponding to a reciprocal of the reference integer I.

3. The encoding method according to claim 2, wherein, in the obtaining step, correction is performed on the quotients and the remainders by using the reference integer I.

4. The encoding method according to claim 3, wherein, when the number of bits x is a decimal fraction and is greater than a predetermined threshold value X (X=m/2, M is a positive odd number), by setting the number of bits to x=X, the high-order bit string is encoded, and the low-order bit string is fixed-length-encoded by handling the low-order bit string as data of a (m–M)/2 bit length.

5. The encoding method according to claim 1, wherein, in the encoding step, the remainders are combined on the basis of expression (1) below, $$Q_i = q_{2i} + I \cdot q_{2i+1} \quad (1)$$

where $Q_i$ indicates the combined remainder, and $q_{2i+1}$ and indicate the remainders of the two consecutive bit strings.

6. An encoding method for dividing a bit string of an input signal at a position of x bits from a least significant bit into a high-order bit string and a low-order bit string, performing variable-length-encoding of the high-order bit string, and performing fixed-length-encoding of the low-order bit string, the encoding method comprising the steps of:
   determining whether m/n is an integer;
   when m/n is an integer, setting a reference integer I to $2^x$ (x=m/n, m is an integer of 0 or more, n is an integer of 3 or more);
   when m/n is not an integer, deriving the reference integer I close to $2^x$;
   obtaining a quotient and a remainder that are determined by performing a dividing operation on numerical values represented respectively by the bit strings by using the reference integer I; and
   performing variable-length-encoding of each of quotients of n consecutive bit strings, combining remainders corresponding to the quotients and performing fixed-length-encoding of the result, and generating a codeword.

7. An encoding apparatus for dividing a bit string of an input signal at a position of x bits from a least significant bit into a high-order bit string and a low-order bit string, performing variable-length-encoding of the high-order bit string, and performing fixed-length-encoding of the low-order bit string, the encoding apparatus comprising:
   determining means for determining whether an integer m of 0 or more is even or odd;
   setting means for setting, when m is even, a reference integer I to $2^x$ (x=m/2);
   deriving means for deriving, when m is odd, a reference integer I close to $2^x$;
   obtaining means for obtaining a quotient and a remainder that are determined by performing a dividing operation on numerical values represented by the bit strings by using the reference integer I; and
   encoding means for performing variable-length-encoding of each of quotients of two consecutive bit strings, combining remainders corresponding to the quotients and performing fixed-length-encoding of the result, and generating a codeword.

8. An encoding apparatus for dividing a bit string of an input signal at a position of x bits from a least significant bit into a high-order bit string and a low-order bit string, performing variable-length-encoding of the high-order bit string, and performing fixed-length-encoding of the low-order bit string, the encoding apparatus comprising:
   determining means for determining whether m/n is an integer;
   setting means for setting, when m/n is an integer, a reference integer I to $2^x$ (x=m/n, m is an integer of 0 or more, n is an integer of 3 or more);
   deriving means for deriving, when m/n is an integer, the reference integer I close to $2^x$;
   obtaining means for obtaining a quotient and a remainder that are determined by dividing numerical values represented by the bit strings by using the reference integer I; and
   encoding means for performing variable-length-encoding of each of quotients of n consecutive bit strings, combining remainders corresponding to the quotients and performing fixed-length-encoding of the result, and generating a codeword.

9. A computer-readable storage medium storing a program for causing a computer to perform processing for dividing a bit string of an input signal at a position of x bits from a least significant bit into a high-order bit string and a low-order bit string, performing variable-length-encoding of the high-order bit string, and performing fixed-length-encoding of the low-order bit string, the processing comprising the steps of:
   determining whether an integer m of 0 or more is even or odd;
   when m is even, setting a reference integer I to $2^x$ (x=m/2);
   when m is odd, deriving the reference integer I close to $2^x$;
   obtaining a quotient and a remainder that are determined by dividing numerical values represented by the bit strings by using the reference integer I; and
   performing variable-length-encoding of each of quotients of two consecutive bit strings, combining remainders corresponding to the quotients and performing fixed-length-encoding of the result, and generating a codeword.

10. A computer-readable storage medium storing a program for causing a computer to perform processing for dividing a bit string of an input signal at a position of x bits from a least significant bit into a high-order bit string and a low-order bit string, performing variable-length-encoding of the high-order bit string, and performing fixed-length-encoding of the low-order bit string, the processing comprising the steps of:
   determining whether m/n is an integer;
   when m/n is an integer, setting a reference integer I to $2^x$ (x=m/n, m is an integer of 0 or more, n is an integer of 3 or more);
   when m/n is not an integer, deriving the reference integer I close to $2^x$;
   obtaining a quotient and a remainder that are determined by performing a dividing operation on numerical values represented respectively by the bit strings by using the reference integer I; and
   performing variable-length-encoding of each of quotients of n consecutive bit strings, combining remainders corresponding to the quotients and performing fixed-length-encoding of the result, and generating a codeword.

11. A decoding method for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding method comprising the steps of:
   decoding, from the codeword, a quotient obtained by performing a dividing operation on each of numerical values represented respectively by two consecutive bit strings by using a reference integer I, and a combined remainder in which remainders corresponding to the quotients are combined;

determining whether an integer m of 0 or more is even or odd;

when m is even, setting the reference integer I to $2^x$ (x=m/2);

when m is odd, deriving the reference integer I close to $2^x$;

dividing the combined remainder into two remainders on the basis of the reference integer I; and generating a bit string by multiplying the quotient by the reference integer I and by adding, to the result, a remainder corresponding to the quotient.

12. The decoding method according to claim 11, wherein, in the remainder dividing step, the combined remainder is multiplied by an integer corresponding to a reciprocal of the reference integer I.

13. The decoding method according to claim 12, wherein, in the remainder dividing step, correction is performed on each remainder by using the reference integer I.

14. The decoding method according to claim 13, wherein, when the number of bits x is a decimal fraction and is greater than a predetermined threshold value X (X=M/2, M is a positive odd number), by setting the number of bits to x=X, a high-order bit string is generated, data of a (m−M)/2 bit length is fixed-length-decoded, and a low-order bit string is generated.

15. The decoding method according to claim 11, wherein, in the remainder dividing step, the combined remainder is divided on the basis of expression (2) below, $$\begin{cases} \hat{q}_{2i+1} = \hat{Q}_i / \hat{I} \\ \hat{q}_{2i} = \hat{Q}_i - \hat{q}_{2i+1} \cdot \hat{I} \end{cases} \quad (2)$$

where $Q_i$ indicates the combined remainder, and $q_{2i}$ and $q_{2i+1}$ indicate the remainders of the two consecutive bit strings.

16. A decoding method for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding method comprising the steps of:

decoding, from the codeword, a quotient obtained by performing a dividing operation on each of numerical values represented respectively by n (n is an integer of 3 or more) consecutive bit strings by using a reference integer I, and a combined remainder in which remainders corresponding to the quotients are combined;

determining whether m/n is an integer;

when m/n is an integer, setting the reference integer I to $2^x$ (x=m/n, m is an integer of 0 or more);

when m/n is not an integer, deriving the reference integer I close to $2^x$;

dividing the combined remainder into n remainders on the basis of the reference integer I; and generating a bit string by multiplying the quotient by the reference integer I and by adding, to the result, a remainder corresponding to the quotient.

17. A decoding apparatus for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding apparatus comprising:

decoding means for decoding, from the codeword, a quotient obtained by performing a dividing operation on each of numerical values represented respectively by two consecutive bit strings by using a reference integer I, and a combined remainder in which remainders corresponding to the quotients are combined;

determining means for determining whether an integer m of 0 or more is even or odd;

setting means for setting, when m is even, the reference integer I to $2^x$ (x=m/2);

deriving means for deriving, when m is odd, the reference integer I close to $2^x$;

remainder dividing means for dividing the combined remainder into two remainders on the basis of the reference integer I; and generation means for generating a bit string by multiplying the quotient by the reference integer I and by adding, to the result, a remainder corresponding to the quotient.

18. A decoding apparatus for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding apparatus comprising:

decoding means for decoding, from the codeword, a quotient obtained by performing a dividing operation on each of numerical values represented respectively by n (n is an integer of 3 or more) consecutive bit strings by using a reference integer I, and a combined remainder in which remainders corresponding to the quotients are combined;

determining means for determining whether m/n is an integer;

setting means for setting, when m/n is an integer, the reference integer I to $2^x$ (x=m/n, m is an integer of 0 or more);

deriving means for deriving, when m/n is an integer, the reference integer I close to $2^x$;

remainder dividing means for dividing the combined remainder into n remainders on the basis of the reference integer I; and generation means for generating a bit string by multiplying the quotient by the reference integer I and by adding, to the result, a remainder corresponding to the quotient.

19. A computer-readable storage medium for storing program for causing a computer to perform processing for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the processing comprising the steps of:

decoding, from the codeword, a quotient obtained by performing a dividing operation on each of numerical values represented respectively by two consecutive bit strings by using a reference integer I, and a combined remainder in which remainders corresponding to the quotients are combined;

determining whether m/n is an integer;

when m/n is an integer, setting the reference integer I to $2^x$ (x=m/n, m is an integer of 0 or more);

when m/n is not an integer, deriving the reference integer I close to $2^x$;

dividing the combined remainder into two remainders on the basis of the reference integer I; and generating a bit string by multiplying the quotient by the reference integer I and by adding, to the result, a remainder corresponding to the quotient.

20. A computer-readable storage medium for storing program for causing a computer to perform processing for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the processing comprising the steps of:

decoding, from the codeword, a quotient obtained by performing a dividing operation on each of numerical values represented respectively by n (n is an integer of 3 or more) consecutive bit strings by using a reference integer I, and a combined remainder in which remainders corresponding to the quotients are combined;

determining means for determining whether an integer m of 0 or more is even or odd;

setting means for setting, when m is even, the reference integer I to $2^x$ (x=m/2);

deriving means for deriving, when m is odd, the reference integer I close to $2^x$;

dividing the combined remainder into n remainders on the basis of the reference integer I; and generating a bit string by multiplying the quotient by the reference integer I and by adding, to the result, a remainder corresponding to the quotient.

21. An encoding apparatus for dividing a bit string of an input signal at a position of x bits from a least significant bit into a high-order bit string and a low-order bit string, performing variable-length-encoding of the high-order bit string, and performing fixed-length-encoding of the low-order bit string, the encoding apparatus comprising:

a determining unit to determine whether m/n is an integer;

a setting unit to determine, when m/n is an integer, a reference integer I to $2^x$ (x=m/n, m is an integer of 0 or more, n is an integer of 3 or more);

a deriving unit configured to derive, when m/n is an integer, the reference integer I close to $2^x$;

an obtaining unit configured to obtain a quotient and a remainder that are determined by performing a dividing operation on numerical values represented by the bit strings by using the reference integer I; and an encoding unit configured to perform variable-length-encoding of each of quotients of two consecutive bit strings, combining remainders corresponding to the quotients and performing fixed-length-encoding of the result, and generating a codeword.

22. An encoding apparatus for dividing a bit string of an input signal at a position of x bits from a least significant bit into a high-order bit string and a low-order bit string, performing variable-length-encoding of the high-order bit string, and performing fixed-length-encoding of the low-order bit string, the encoding apparatus comprising:

determining means for determining whether m/n is an integer;

setting means for setting, when m/n is an integer, a reference integer I to $2^x$ (x=m/n, m is an integer of 0 or more, n is an integer of 3 or more);

a deriving unit configured to derive, when m/n is an integer, the reference integer I close to $2^x$;

an obtaining unit configured to obtain a quotient and a remainder that are determined by dividing numerical values represented by the bit strings by using the reference integer I; and an encoding unit configured to perform variable-length-encoding of each of quotients of n consecutive bit strings, combining remainders corresponding to the quotients and performing fixed-length-encoding of the result, and generating a codeword.

23. A decoding apparatus for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding apparatus comprising:

a decoding unit configured to decode, from the codeword, a quotient obtained by performing a dividing operation on each of numerical values represented respectively by two consecutive bit strings by using a reference integer I, and a combined remainder in which remainders corresponding to the quotients are combined;

a determining unit configured to determine whether an integer m of 0 or more is even or odd;

a setting unit configured to setting, when m is even, the reference integer I to $2^x$ (x=m/2);

a deriving unit configured to derive, when m is odd, the reference integer I close to $2^x$;

a remainder dividing unit configured to divide the combined remainder into two remainders on the basis of the reference integer I; and a generation unit configured to generate a bit string by multiplying the quotient by the reference integer I and by adding, to the result, a remainder corresponding to the quotient.

24. A decoding apparatus for decoding a codeword in which a bit string of an input signal is divided at a position of x bits from a least significant bit into a high-order bit string and a low-order bit string, the high-order bit string is variable-length-encoded, and the low-order bit string is fixed-length-encoded, the decoding apparatus comprising:

a decoding unit configured to decode, from the codeword, a quotient obtained by performing a dividing operation on each of numerical values represented respectively by n (n is an integer of 3 or more) consecutive bit strings by using a reference integer I, and a combined remainder in which remainders corresponding to the quotients are combined;

a determining unit configured to determine whether m/n is an integer;

a determining unit configured to set, when m/n is an integer, the reference integer I to $2^x$ (x=m/n, m is an integer of 0 or more, n is an integer of 3 or more);

a deriving unit configured to derive, when m/n is an integer, the reference integer I close to $2^x$;

a remainder dividing unit configured to divide the combined remainder into n remainders on the basis of the reference integer I; and a generation unit configured to generate a bit string by multiplying the quotient by the reference integer I and by adding, to the result, a remainder corresponding to the quotient.

* * * * *